United States Patent
Jarmon et al.

(10) Patent No.: US 8,127,555 B2
(45) Date of Patent: Mar. 6, 2012

(54) FLOWPATH HEAT EXCHANGER FOR THERMAL MANAGEMENT AND POWER GENERATION WITHIN A HYPERSONIC VEHICLE

(75) Inventors: David C. Jarmon, Kensington, CT (US);
Mark A. Sillence, Juno Isles, FL (US);
Paul Attridge, Colchester, CT (US);
Jean Yamanis, South Glastonbury, CT (US)

(73) Assignee: Pratt & Whitney Rocketdyne, Inc., Canoga Park, CA (US)

( * ) Notice: Subject to any disclaimer, the term of this patent is extended or adjusted under 35 U.S.C. 154(b) by 1333 days.

(21) Appl. No.: 11/955,606

(22) Filed: Dec. 13, 2007

(65) Prior Publication Data
US 2009/0151321 A1    Jun. 18, 2009

(51) Int. Cl.
*F02K 7/08* (2006.01)
(52) U.S. Cl. .......................... 60/768; 60/267
(58) Field of Classification Search .............. 60/266, 60/267, 730, 767, 768, 801, 39.83; 244/53 R, 244/57, 58, 59, 60
See application file for complete search history.

(56) References Cited

U.S. PATENT DOCUMENTS

| | | | |
|---|---|---|---|
| 2,836,379 A | 5/1958 | Salmon | |
| 2,990,775 A * | 7/1961 | West Henson | 60/266 |
| 3,358,457 A | 12/1967 | Caldwell | |
| 3,470,703 A * | 10/1969 | Wen Lian-Tong | 62/86 |
| 3,535,882 A | 10/1970 | Tizio | |
| 3,831,375 A | 8/1974 | Richard et al. | |
| 4,372,211 A * | 2/1983 | Dante | 102/207 |
| 5,088,280 A * | 2/1992 | Scott-Scott et al. | 60/257 |
| 5,116,251 A | 5/1992 | Bichler et al. | |
| 5,149,018 A | 9/1992 | Clark | |
| 5,272,870 A | 12/1993 | Grieb | |
| 5,313,790 A | 5/1994 | Barr | |
| 5,337,553 A | 8/1994 | Barr | |
| 5,452,866 A | 9/1995 | Bulman | |
| 5,584,183 A * | 12/1996 | Wright et al. | 62/3.7 |
| 6,397,581 B1 | 6/2002 | Vidal et al. | |
| 6,715,293 B2 | 4/2004 | Sillence et al. | |
| 6,804,963 B1 | 10/2004 | Tomoiu | |
| 6,880,342 B1 | 4/2005 | Moorhouse | |

(Continued)

FOREIGN PATENT DOCUMENTS

EP    1746257    1/2007

OTHER PUBLICATIONS

Robert F. Faulkner, James W. Weber, "Hydrocarbon Scramjet Propulsion System Development, Demonstration and Application," American Institute of Aeronautics & Astronautics.

*Primary Examiner* — Louis Casaregola
*Assistant Examiner* — Phutthiwat Wongwian
(74) *Attorney, Agent, or Firm* — Carlson Gasley & Olds PC

(57) ABSTRACT

An electrical power generation system incorporates thermoelectric devices (TE Devices) for electrical power generation adjacent a flow path heat exchanger (HEX) adjacent to a vehicle flowpath structure such as a scramjet flow path to take advantage of the waste heat, high thermal gradients, and available, unused volume. A thermally conductive material communicates thermal energy from a vehicle external skin structure to the TE Device while a thermally conductive compliant material allows the TE Device to "float" with minimal mechanical stress.

16 Claims, 5 Drawing Sheets

U.S. PATENT DOCUMENTS

| | | |
|---|---|---|
| 6,883,330 B2 | 4/2005 | Guinan et al. |
| 7,188,477 B2 | 3/2007 | Cuva |
| 7,779,811 B1 * | 8/2010 | Mailander et al. ............ 123/399 |
| 2005/0022855 A1 * | 2/2005 | Raver ............................ 136/205 |
| 2007/0018038 A1 * | 1/2007 | Jarmon et al. .................. 244/59 |
| 2007/0139193 A1 * | 6/2007 | Arik et al. ................. 340/539.26 |
| 2010/0236595 A1 * | 9/2010 | Bell et al. ...................... 136/205 |

* cited by examiner

FLOWPATH HEAT EXCHANGER FOR THERMAL MANAGEMENT AND POWER GENERATION WITHIN A HYPERSONIC VEHICLE

BACKGROUND OF THE INVENTION

The present invention relates to a heat exchanger, and more particularly to a flowpath heat exchanger structure that incorporates thermoelectric devices (TE Devices) for electrical power generation.

Hypersonic vehicles having fuel-cooled supersonic combustion ramjet (scramjet) dual mode engines enable missions such as time critical target service, global reach, responsive space launch, and space mission denial. Because of the propulsion system flowpath environmental conditions, both internally and externally, fuel cooling provides thermal management of the engine flowpath structure since it may not be practical to use air or radiation cooling at hypersonic operating conditions.

Hypersonic vehicles will require electrical power for fuel pumps, drive actuators, and other propulsion and vehicle systems. Low speed systems, such as turbine based propulsion, can generate power while operational, but other power generation systems are required during dual mode scramjet operation. Power generation by conventional methods, such as batteries, expander cycle turbo-generators, and ram-air turbines may be problematic since hypersonic propulsion systems are sensitive to weight, volume and subsystem packaging.

SUMMARY OF THE INVENTION

An electrical power generation system according to an exemplary aspect of the present invention incorporates thermoelectric devices (TE Devices) adjacent a flowpath heat exchanger (HEX) and external skin structure to take advantage of the waste heat, high thermal gradients, and available volume provided by the flowpath structure. One side of the TE Device is bonded in a manner to maximize thermal gradient while the other side floats to minimize stresses created by differential thermal expansion. A thermal conductive material communicates thermal energy from the vehicle external skin structure or the HEX to the TE Device while a thermally conductive compliant material allows the TE Device to float with minimal mechanical stress.

BRIEF DESCRIPTION OF THE DRAWINGS

The various features and advantages of this invention will become apparent to those skilled in the art from the following detailed description of the currently disclosed embodiment. The drawings that accompany the detailed description can be briefly described as follows.

DETAILED DESCRIPTION OF THE DISCLOSED EMBODIMENT

Figure 1:
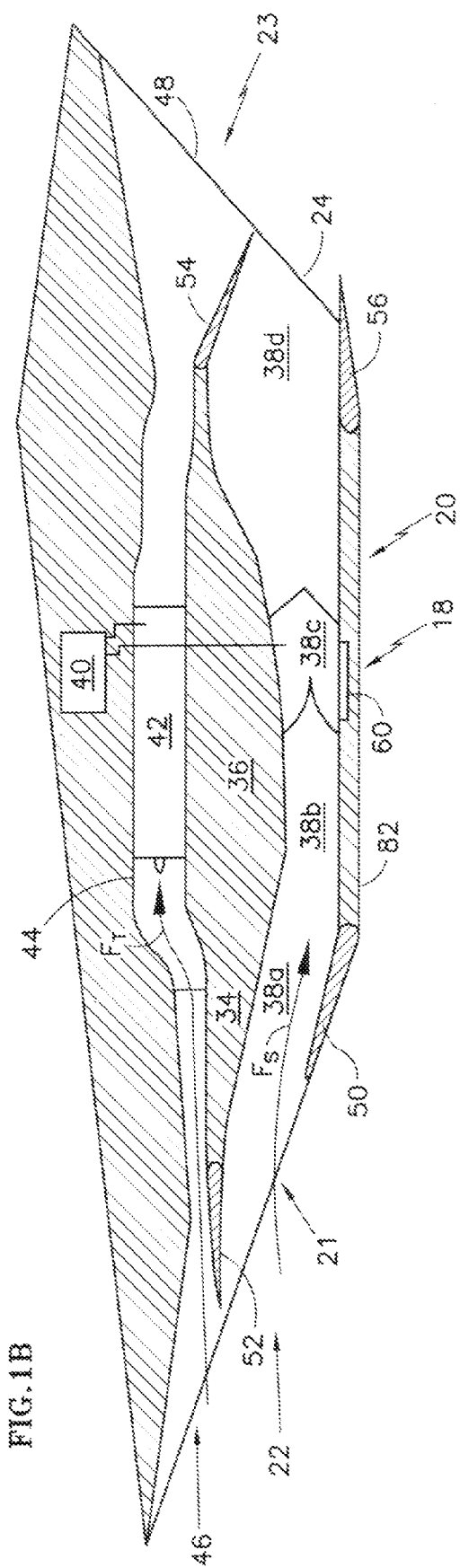
FIG. 1A is a general schematic view of a hypersonic aircraft.
FIG. 1B is a schematic sectional expanded view of an engine package for use with the turbine based combined cycle hypersonic aircraft of FIG. 1A.

FIG. 1A schematically illustrates a vehicle 10. The disclosed embodiment schematically illustrates a hypersonic aircraft. Vehicles may be manned or unmanned, may be reusable or may be one-way such as warhead carrying missiles or disposable launch vehicles. The disclosed hypersonic propulsion system 18 is a gas turbine (subsonic and supersonic combustion) and supersonic ramjet engine (dual mode scramjet-DMSJ). It should be understood that other propulsion systems such a rocket based combined cycle engines and dual mode ramjet or scramjet engines or supersonics combustion ramjets (Scramjets) may also benefit herefrom.

The vehicle 10 generally includes a fuselage 12, a wing structure 14, and an empennage 16. The DMSJ propulsion system 18 is located within an engine package 20 defined in part by an underside of the fuselage 12. The engine package 20 is defined between a forward inlet 22 such as an intake structure and an aft outlet 23 such as an exhaust nozzle structure. The flowpath and flow path structure defined therebetween may be rectangular, annular (circular), elliptical, or complex in shape and may integrate at various positions with respect to the vehicle. Shock interactions and vehicle operation dictate that the DMSJ propulsion system 18 be highly integrated into the overall airframe design. The engine package 20 is placed to take advantage of the shock generated by the vehicle forebody. The flow is compressed behind the shock which increases pressure within the DMSJ propulsion system 18 so as to produce greater thrust. In addition, the aft portion of the vehicle is designed to promote expansion of the exhaust and is essentially an extension of the scramjet nozzle. That is, the entire undersurface of the vehicle may be considered to be part of the propulsion system.

Referring to FIG. 1B, the engine package 20 can be, in part, defined by a forebody 34, an isolator 38b (often integrated therewith), and a vehicle external skin structure 82. The vehicle external skin structure 82 is disclosed herein as a portion of the engine package 20 but may alternatively be at other vehicle locations. A combustor 38c is located along a scramjet flowpath $F_S$ to direct a hypersonic flow between a forward inlet 21 and an aft outlet 24. A control system 40—typically a portion of the aircraft flight control system avionics—may control operation of the engine system 18 in response to one or more of sensor inputs, operator inputs, and the like.

For a turbine based combined cycle system, a gas turbine engine 42 is located along a turbine engine flowpath 44 which directs subsonic and supersonic flow $F_T$ between a forward inlet 46 and an aft outlet 48 separate from the scramjet flowpath $F_S$. The gas turbine engine 42 may be partially recessed into the fuselage 12 above the combustor 38. Scramjet inlet flaps 50, turbine inlet flaps 52, turbine outlet flaps 54, and scramjet outlet flaps 56 selectively control the scramjet flowpath $F_S$ and turbine flowpath $F_T$ in response to scramjet and turbine operation. Turbine outlet flaps 54 and scramjet outlet flaps 56 selectively control the turbine flowpath $F_T$ so as to provide an efficient nozzle for the scramjet flowpath $F_S$. It should be understood that the disclosed embodiment illustrated is merely exemplary and that various engine packages and propulsion systems may be utilized.

Figure 2:
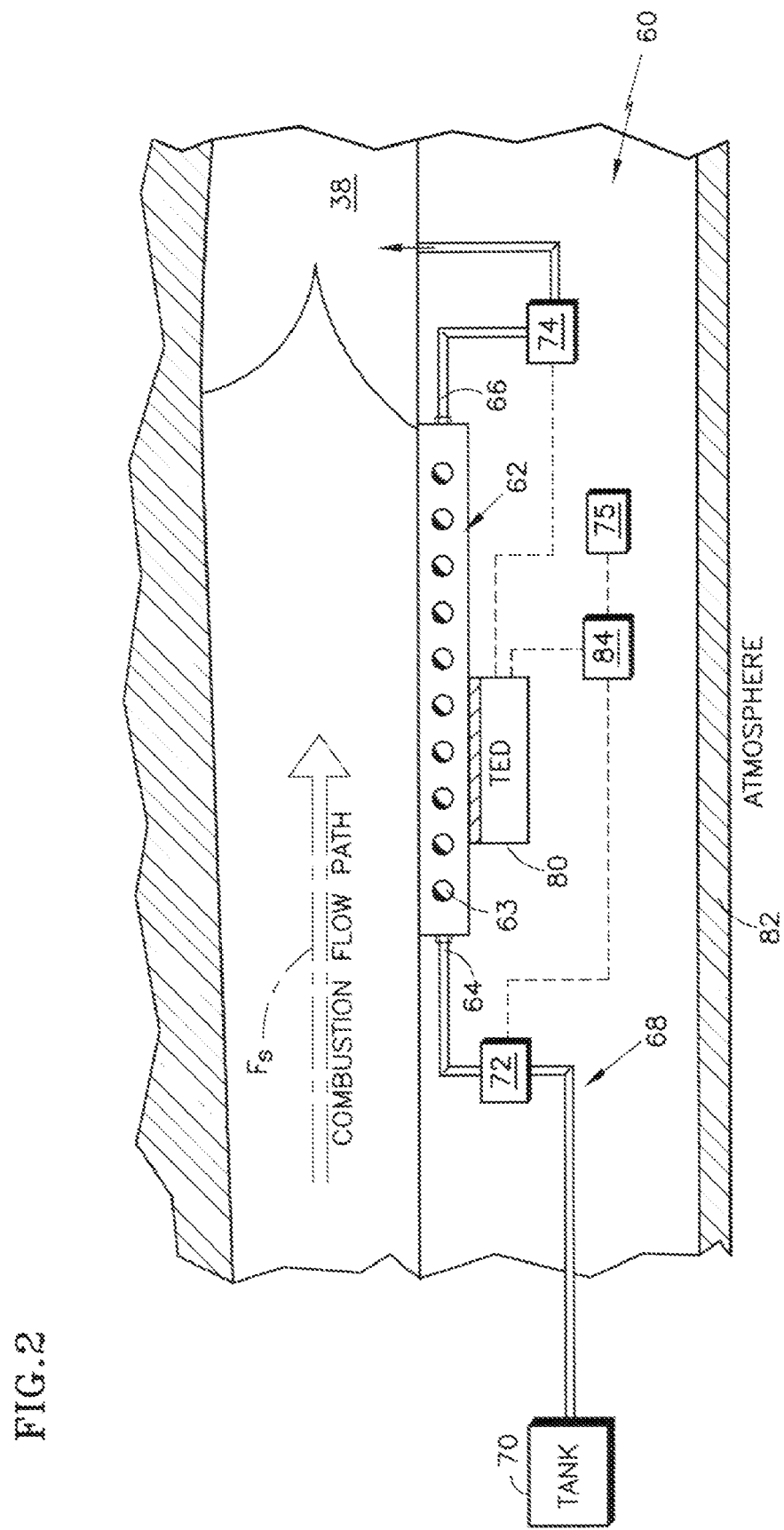
FIG. 2 is a schematic sectional view illustrating an electrical power generation system according to the present invention for use with the aircraft illustrated in FIG. 1A.

Referring to FIG. 2, an electrical power generation system 60 includes a heat exchanger (HEX) 62 adjacent the scramjet flowpath Fs to transfer heat from a heat gradient between the atmosphere and combustion gases to pre-combustion scramjet fuel. The HEX 62 may be located anywhere along the scramjet flowpath $F_S$, where sufficient delta temperature can be realized, such as adjacent the inlet 38a, isolator 38b, combustor 38c or nozzle 38d. For an exemplary hydrocarbon based liquid fuel such as JP 8, JP 7 or methane, the HEX 62 may be a liquid-gas heat exchanger. Alternatively, the exemplary fuel may be hydrogen gas and the heat exchanger a gas-gas heat exchanger.

The HEX 62 includes an upstream fuel inlet 64 and a downstream fuel outlet 66. In the exemplary embodiment, the inlet 64 may be upstream of the combustor 38c along the scramjet flowpath $F_S$ because pre-combustion aerodynamic heating may be relevant. A fuel flowpath 68 for the scramjet fuel extends from a tank 70 to a fuel pump 72 and then to the inlet 64. After exiting the outlet 66, heated fuel is communicated along the fuel flowpath 68 to a fuel distribution valve network 74 and then to the combustor 38c. The fuel distribution valve network 84 distributes fuel to various combustor injection locations for various purposes such as pilot flow, main combustion flow, and staging. Variations for cooling the engine include multiple inlet and outlet networks, circumferential coolant flow and coolant flow from downstream to upstream.

The HEX 62 is in communication with at least one thermoelectric device (TE Device) 80. The HEX 62 and the TE Device 80 may be located adjacent the scramjet flowpath $F_S$ and adjacent a vehicle external skin structure 82 to take advantage of the waste heat, high thermal gradients, and available, unused volume that typically exist therein. The vehicle external skin structure 82 may include various vehicle structure and is representative of various vehicle locations such as the engine package 20. The vehicle external skin structure 82 is exposed to atmosphere and thus aerodynamic heating.

The TE Device 80 may be coupled to an electrical power conditioning, storage, and distribution system 84 which receives raw electrical input and outputs desired conditioned electricity of a constant and proper voltage to drive, for example, the control system 40 (FIG. 1B), fuel pump 72, distribution valve network 74 and similar components associated with the dual mode scramjet engine system 18, as well as other loads 75, including engine and vehicle power requirements for items such as actuators for flaps 50, 52, 54, and 56 (FIG. 1B).

The power-to-mass ratio of a conventional TE Device 80 has the potential of being as high as 100 W/g or greater. For large manned hypersonic vehicles, TE Devices have the potential to provide 1 to 6 MW of electrical power required for vehicle subsystems at substantial weight/space savings compared to conventional systems, such as batteries and expander cycle turbo-generators. For missiles, TE Devices have the potential to generate 8 kW of power, or more, required for missile operation at a weight savings compared to battery power.

Figure 3:
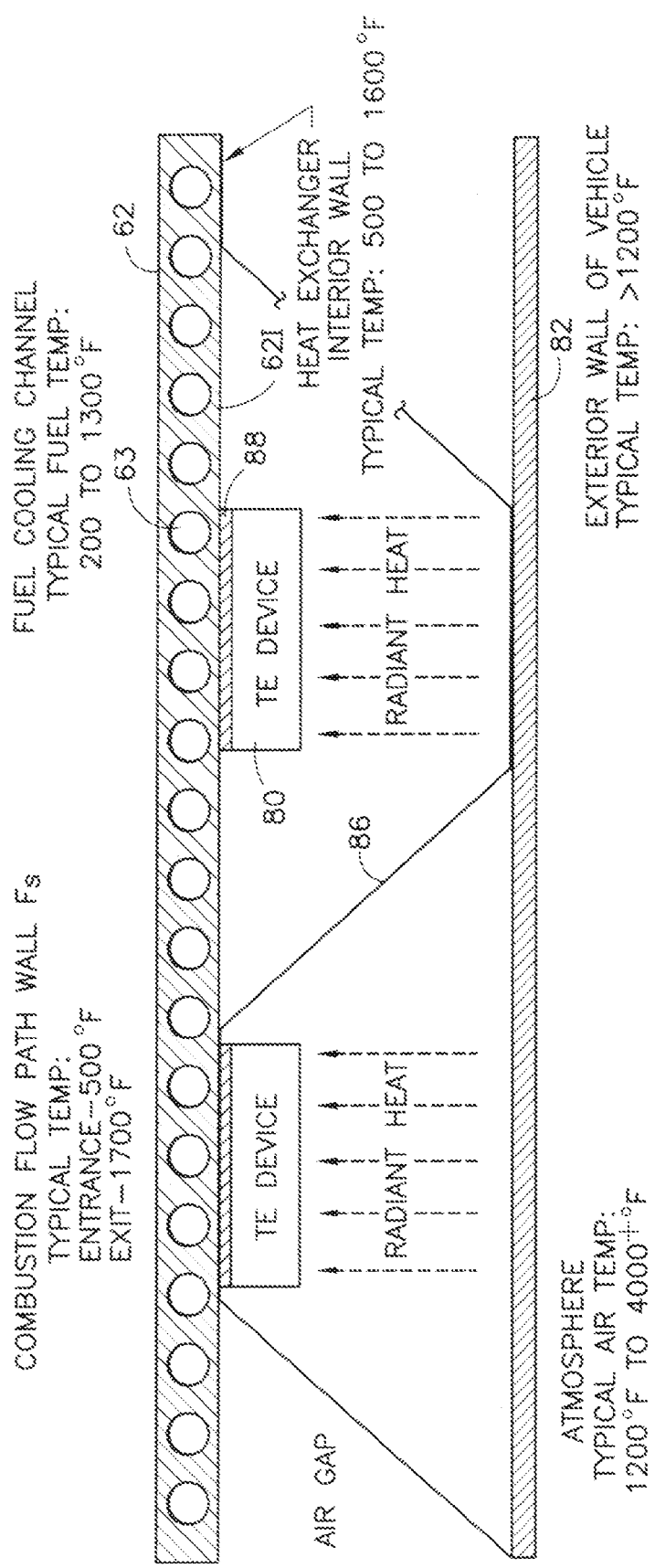
FIG. 3 is one embodiment of the electrical power generation system which utilizes radiant heat.

Referring to FIG. 3, the flowpath structure 24 includes the HEX 62 located adjacent to the external skin structure 82 of the vehicle through a support structure 86 such as a truss, bladed stiffener, "I" beam, or such like. Although illustrated in a transverse arrangement for sake of clarity in the illustrated non-limiting embodiment, the internal fuel cooled channels 63 may more typically be parallel to the flowpath $F_S$.

Radiant Heating Approach

In a radiant heating approach each TE Device 80 is bonded to an interior wall 62I of the HEX 62 relative to the flowpath $F_s$. It should be understood that the TE Device 80 may be mounted directly to the HEX 62 or the support structure 86 which supports the HEX 62 through a bond material 88. Radiant heat from the vehicle external skin structure 82 heats the non-bonded side of the TE Device 80 and produces a thermal gradient in the TE Device 80 for power generation.

There are numerous locations adjacent the flowpath $F_S$ with sufficient thermal gradients (in excess of 300° F.) to enable the embedded TE Devices 80 to produce useful levels of electrical power. In the disclosed embodiment, the thermal gradient is provided adjacent the scramjet flowpath $F_S$. In the disclosed embodiment, the HEX 62 may form a wall of the scramjet flowpath $F_S$. The typical wall temperatures along the combustion flowpath $F_S$ may be approximately 500 degrees F. at the coolant intake and 1700 degrees F. at the coolant exit such that the typical fuel temperature within a multiple of HEX internal fuel cooled channels 63 may be between approximately 200-1300 degrees F. The vehicle external skin structure 82 which, in the embodiment, may be the side or underside of the engine package 20, or topside in some integrations, may be approximately 1200 to 1800 degrees F. and typical air temperature at hypersonic speeds may be between approximately 1200-4000+ degrees F.

Conduction Heating Approach

Figure 4:
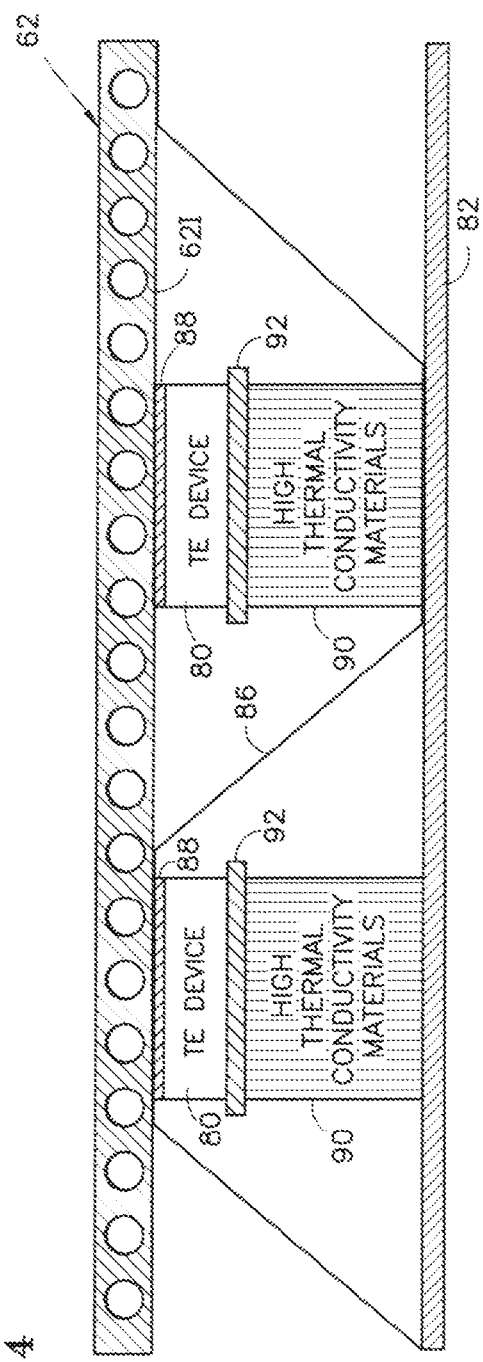
FIG. 4 is another embodiment of the electrical power generation system illustrating the use of high thermal conductivity materials intermediate a thermoelectric device and a vehicle outer skin structure.

Referring to FIG. 4, in a conduction heating approach each TE Device 80 is bonded to the interior wall 62I of the HEX 62 through the bond material 88. A high thermal conductivity material 90 communicates thermal energy from the vehicle external skin structure 82 to the TE Device 80 through a thermally conductive compliant material 92 to allow the TE Device 80 to essentially "float" with minimal mechanical stress. That is, the thermally conductive compliant material 92 accommodates relative movement between the HEX 62 and the vehicle external skin structure 82.

Figure 5:
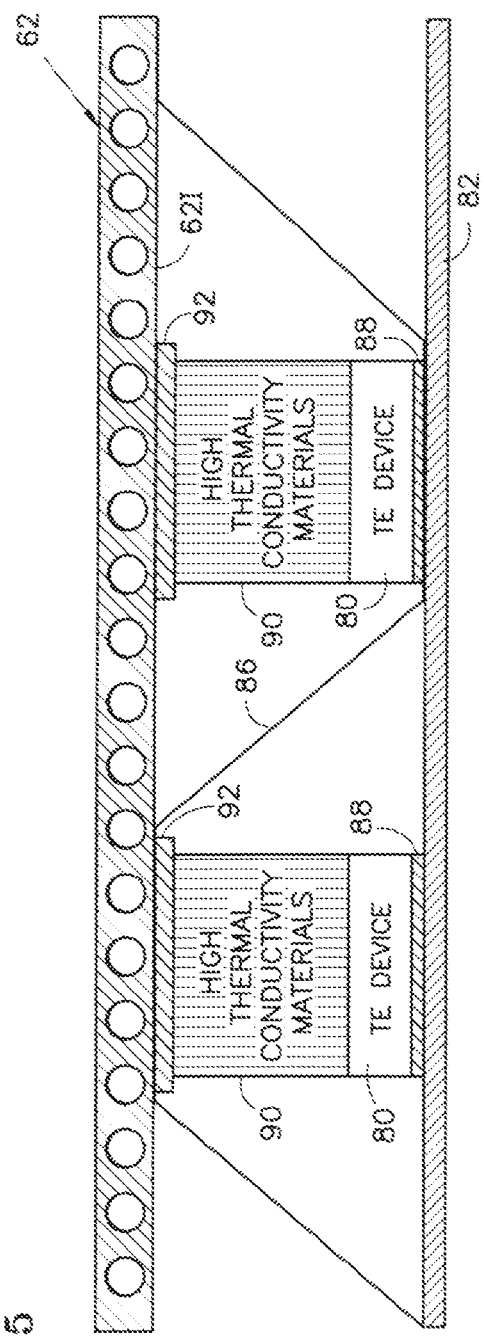
FIG. 5 is another embodiment of the electrical power generation system illustrating thermoelectric devices adjacent to the vehicle external skin structure.

Referring to FIG. 5, in an alternative conduction heating approach each TE Device 80 is bonded to the vehicle external skin structure 82 through the bond material 88. The high conductivity material 90 is located adjacent to the interior wall 62I of the HEX 62.

Figure 6:
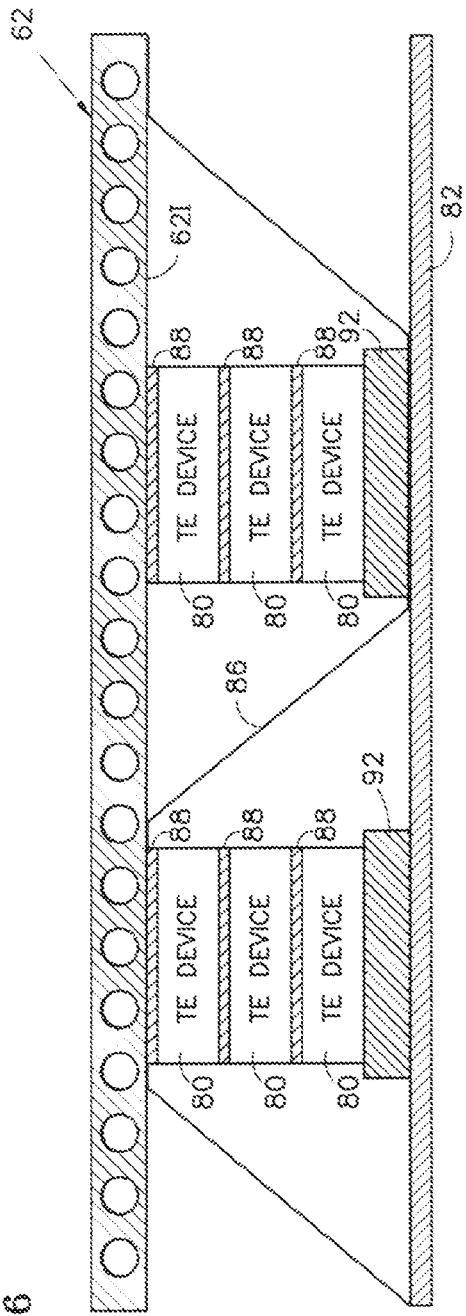
FIG. 6 is another embodiment of the electrical power generation system illustrating a multiple of thermoelectric devices in a stacked configuration.

Referring to FIG. 6, in another alternative conduction heating approach multiple TE Devices 80 are stacked in series. Each TE Device 80 is bonded to the adjacent TE Device 80 through the bond material 88 while the thermally conductive compliant material 92 allows the stack to float with minimal mechanical stress. It should be understood that the thermally conductively compliant material 92 may alternatively be located adjacent the HEX 62.

Dielectric Interface

Figure 7:
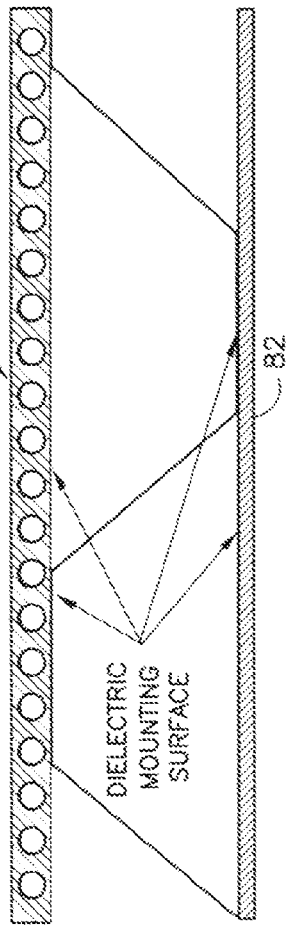
FIG. 7 is a sectional schematic view illustrating the dielectric mounting surfaces for receipt of the thermoelectric devices.

The TE Device 80 is electrically insulated through a dielectric interface (FIG. 7). If the TE Device outer surfaces are not dielectric than a dielectric interface may be on the vehicle structure and the HEX surfaces to which the TE Device is mounted.

Aluminum oxide, also known as alumina, is one dielectric material that is used extensively in conventional TE Device modules. However, the use of alumina sheets or plates in the scramjet may be complicated because alumina has very low coefficient of thermal expansion (CTE) (~7×10−6 m/m/K, aka 7 ppm/K) while Ni-based superalloys have CTEs of 15-18 ppm/K.

Elimination of the alumina-sheet may be achieved with an alumina-forming alloy, i.e., any alloy that forms an adherent, alumina scale which is inherently dielectric. An alumina scale thickness of a few micrometers would be sufficient for electrical isolation. Alternatively, the materials utilized to fabricate the scramjet may be alumina-forming alloys that would be oxidized at the appropriate temperature, atmosphere and time to develop the alumina scale. Alternative dielectric materials are nitrides such as silicon nitride layers that are routinely deposited on semiconductor devices to achieve electrical isolation. Nitriding processes form nitride compounds with some of the alloy's constituents, i.e., chromium nitride, and these processes are amply developed and well known in the art.

Bonding Material

The bond material 88 may include low melting point metals, Silver-copper alloys, and Active-metal brazing alloys. It should be understood that other bonding materials may alternatively or additionally be utilized.

A low melting point metal, for example, Tin having a melting point (m.p.) of 231.93° C. may be utilized as the bonding material as Tin may accommodate materials with very different coefficients of thermal expansion (CTE) since the liquid does not sustain strains. Moreover, liquid tin has very low vapor pressure to temperatures higher than the present range envisioned for the TE Device and as a result liquid tin would be a good bond material in a non-oxidizing atmosphere. The bond survives large excursions in temperature as is the present case where the temperature differentials can be as much as 1112 degrees F. The low melting point of Tin ensures strains that may develop in the solid state from the melting point to room temperature are low, because of the low differential temperature between the tin m.p. and ambient temperature, and inconsequential.

Another metal that may be used as a bonding material is indium (In). Indium can also be used as an alloying element with tin. Along the same line, bismuth (Bi) may also be utilized.

Other metals that can be used with either tin or indium or Sn—In alloys are antimony, zinc, bismuth, and silver could be considered as alloying elements in order to improve some key property of the alloy such as wetting and/or thermomechanical behavior. It should be understood that these are example materials only and that the list should not be considered to exclude other such materials.

While the aforementioned metals or alloys are not known to be capable of operating at high temperatures in oxidizing atmospheres, the application of these materials in bonding TE Devices to the vehicle surfaces and the use of oxidation sensitive TE Device materials may alternatively be utilized in combination with control of the internal atmosphere where the TE Device is mounted using inert or non-oxidizing gas mixtures.

Metals may not wet ceramics and as a result, the dielectric, i.e., alumina scale or nitride, surface must first be metallized so as to become wettable by the metals and alloys discussed above. Metallizations may be utilized with manganese materials and processes that are well known in the field or on copper-silver alloys or active-metal brazing alloys. Silver-copper alloys are known to bond both metal and ceramic surfaces. These are applied as a powder on the alumina or nitride surface, and then heated in air to the appropriate temperature to establish bonding. During the heat treatment copper oxidizes and establishes a bond to the ceramic surface.

These example bonding materials establish a hard bond that will likely be in the solid state from the operating temperature down to room temperature such that CTE mismatch may give rise to unacceptable strains. As such, the use of metal honeycombs or other metallic compliant structures may additionally or alternatively also be implemented as interlayers.

Another bond material 88 for bonding to the dielectric surface, i.e., alumina scale or nitride surface is the use of active-metal brazing. Silver-ABA® (Morgan Advanced Ceramics' Wesgo® Metals) is one example and contains active metal titanium that bonds to the alumina surface when it is heated up to about 1688 degrees F. in a high vacuum furnace. Other active-metal brazing alloys are Ticusil®, Cusil-ABA®, Cusin-1-ABA®, and Incusil-ABA®. These active-metal brazing alloys have brazing temperatures of 900, 815, 805, and 715 degrees C., respectively.

High Thermal Conductivity Materials

Materials for the thermally conductive compliant material 92 may include metal felt, metal wool, metal honeycomb, and porous structures filled with low melting point metals to mitigate thermal stresses and strains arising from potential CTE mismatch while presenting very low thermal resistance at the interface.

Metal Felts

Metal felts and metal wool provide thermal contact and isolation of components to minimize thermal strains and stresses, however, metal felts and metal wool are very compliant and may creep. As such, metal felt/wool may most beneficially be utilized as intermediate materials within the TE Device stack material as shown in, for example, FIG. 6 with the compliant wool or felt replacing the bond material and with appropriate mechanical strapping mechanisms.

Metal felt or metal wool that does not oxidize is desirable. In particular, silver based felt or wool may be utilized in air or oxidizing atmospheres. An alternative to silver based materials, is a silver-copper alloy wool or felt. Such a material will actually form some bonds with both ceramic and metallic surfaces and provide increased heat transfer and structural integrity.

Should the internal cavity where the TE Device is mounted be purged and filled with an inert gas, still other metals or alloys may alternatively or additionally be operable. In such inert atmospheres, high porosity porous metals manufactured of nickel or copper may be used as these materials are very ductile and yield under relatively low stresses.

Metal Honeycombs

Alternatively, or in addition thereto, metal honeycomb may be utilized as the thermally conductive compliant material 92. Metal honeycombs in combination with bonding materials provide a gradient in thermal expansion to mitigate thermal stresses and strains. In particular, honeycombs with a fine gauge wall having serrated or slotted surfaces may be utilized as an interlayer to relieve the structure from thermal strains yet robustly resist thermal transients.

Porous Structures With Low Melting Point Metal Filled Surface Porosity

Figure 8:
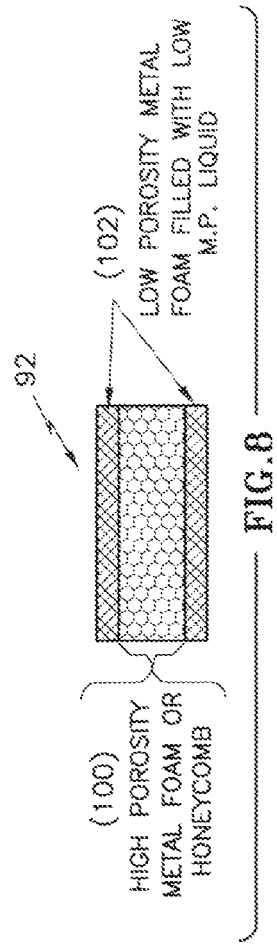
FIG. 8 is a perspective sectional view of a thermally conductive compliant material for use with the thermoelectric devices.

Referring to FIG. 8, one non-limiting embodiment of a thermally conductive compliant material 92A includes a high porosity material layer 100 such as metal foam or honeycomb bonded (metallurgically) between a first and second low porosity foam layer 102. The low porosity foam skin layer 102 is less thick than the high porosity material layer 100. The low porosity foam skin layer 102 may additionally be filled with a low melting point metal or alloy filler. This approach provides a bond between the TE Device 80 and, for example only, the vehicle external skin structure 82 at temperatures below the melting point of the filler, yet provides for relative motion between the components above the filler melting point to maintain an effective thermal contact between the components with increased structural robustness relative to metal felts and metal wools.

It should be understood that relative positional terms such as "forward," "aft," "upper," "lower," "above," "below," and the like are with reference to the normal operational attitude of the vehicle and should not be considered otherwise limiting.

It should be understood that although a particular component arrangement is disclosed in the illustrated embodiment, other arrangements will benefit from the instant invention.

Although particular step sequences are shown, described, and claimed, it should be understood that steps may be performed in any order, separated or combined unless otherwise indicated and will still benefit from the present invention.

The foregoing description is exemplary rather than defined by the limitations within. Many modifications and variations of the present invention are possible in light of the above teachings. The disclosed embodiments of this invention have been disclosed, however, one of ordinary skill in the art would recognize that certain modifications would come within the scope of this invention. It is, therefore, to be understood that within the scope of the appended claims, the invention may be practiced otherwise than as specifically described. For that reason the following claims should be studied to determine the true scope and content of this invention.

What is claimed is:

1. An electrical power generation system comprising:
   a heat exchanger adjacent a scramjet combustion flow path;
   a vehicle external skin structure;
   a support structure which mounts said heat exchanger to said vehicle external skin structure; and
   a thermoelectric device mounted between said heat exchanger and said vehicle external skin structure, said thermoelectric device bonded to said heat exchanger such that radiant heat from said vehicle external skin structure heats a non-bonded side of said thermoelectric device to produce a thermal gradient within the thermoelectric device power generation.

2. The system as recited in claim 1, wherein said heat exchanger forms at least a partial boundary of said combustion flow path.

3. The system as recited in claim 1, wherein said support structure includes a truss structure.

4. The system as recited in claim 1, further comprising a thermally conductive material in contact with said vehicle external skin structure, said thermally conductive material in contact with said thermoelectric device through a thermally conductive compliant material.

5. The system as recited in claim 1, wherein said thermoelectric device is bonded to said heat exchanger through said support structure.

6. The system as recited in claim 1, wherein said thermoelectric device is bonded to said vehicle external skin structure.

7. The system as recited in claim 6, further comprising a thermally conductive material adjacent said heat exchanger, said thermally conductive material is in contact with said thermoelectric device and in contact with said vehicle external skin structure through a thermally conductive compliant material.

8. The system as recited in claim 1, further comprising a thermally conductive material adjacent said thermoelectric device.

9. The system as recited in claim 1, wherein said thermoelectric device is bonded to said heat exchanger with a bond material that includes at least one of a low melting point metal, a Silver-copper alloy and an active-metal brazing alloy.

10. A hypersonic vehicle comprising:
    a vehicle external skin structure;
    a heat exchanger adjacent a scramjet combustion flow path; and
    a thermoelectric device mounted between said heat exchanger and said external skin structure, said thermoelectric device bonded to said heat exchanger such that radiant heat from said vehicle external skin structure heats a non-bonded side of said thermoelectric device to produce a thermal gradient within the thermoelectric device power generation.

11. The vehicle as recited in claim 10, wherein said heat exchanger forms an internal wall of said combustion flow path.

12. The system as recited in claim 10, further comprising a thermally conductive material adjacent said thermoelectric device.

13. The system as recited in claim 12, wherein said thermally conductive material is in contact with said external skin structure.

14. The system as recited in claim 12, further comprising a thermally conductively compliant material intermediate said thermally conductive material and said external skin structure.

15. The system as recited in claim 12, further comprising a thermally conductive compliant material intermediate said thermally conductive material and said heat exchanger.

16. An electrical power generation system comprising:
    a heat exchanger adjacent a scramjet combustion flow path;
    a vehicle external skin structure;
    a support structure which mounts said heat exchanger to said vehicle external skin structure;
    a thermoelectric device mounted between said heat exchanger and said vehicle external skin structure, said thermoelectric device bonded to said vehicle external skin such that radiant heat from said vehicle external skin structure heats a non-bonded side of said thermoelectric device to produce a thermal gradient within the thermoelectric device power generation; and
    a thermally conductive material adjacent said heat exchanger, said thermally conductive material is in-contact with said-heat exchanger through a thermally conductive compliant material.

* * * * *